United States Patent
Choi

(10) Patent No.: US 11,342,942 B2
(45) Date of Patent: May 24, 2022

(54) ELECTRONIC DEVICE FOR PERFORMING ERROR CORRECTION OPERATION AND ERROR CHECK OPERATION

(71) Applicant: SK hynix Inc., Icheon-si (KR)

(72) Inventor: Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/008,210

(22) Filed: Aug. 31, 2020

(65) Prior Publication Data
US 2021/0391874 A1  Dec. 16, 2021

(30) Foreign Application Priority Data
Jun. 10, 2020 (KR) .................. 10-2020-0070400

(51) Int. Cl.
*H03M 13/29* (2006.01)
*G06F 11/10* (2006.01)

(52) U.S. Cl.
CPC ..... *H03M 13/2906* (2013.01); *G06F 11/1076* (2013.01)

(58) Field of Classification Search
CPC .................. G06F 11/1076; H03M 13/2906
See application file for complete search history.

(56) References Cited

U.S. PATENT DOCUMENTS

| 9,660,656 B2 | 5/2017 | Subramanian et al. |
| 2010/0332949 A1* | 12/2010 | d'Abreu .............. G06F 11/1076 714/766 |
| 2012/0110398 A1* | 5/2012 | Lee .................... G06F 11/1004 714/718 |
| 2015/0378817 A1* | 12/2015 | Tsern ................. G06F 11/1402 714/764 |
| 2016/0308540 A1* | 10/2016 | Subramanian ........... G06F 1/10 |

FOREIGN PATENT DOCUMENTS

KR 101636485 B1 7/2016

* cited by examiner

*Primary Examiner* — Guy J Lamarre
(74) *Attorney, Agent, or Firm* — William Park & Associates Ltd.

(57) ABSTRACT

An electronic device includes a replica delay circuit configured to generate a delayed error check signal by delaying a first error check signal including error information of first data stored in a first memory region. The electronic device also includes an error sum signal generation circuit configured to generate an error sum signal by summing a second error check signal including error information of second data stored in a second memory region and the delayed error check signal.

21 Claims, 12 Drawing Sheets

ELECTRONIC DEVICE FOR PERFORMING ERROR CORRECTION OPERATION AND ERROR CHECK OPERATION

CROSS-REFERENCE TO RELATED APPLICATION

The present application claims priority under 35 U.S.C. § 119(a) to Korean Patent Application No. 10-2020-0070400, filed on Jun. 10, 2020, in the Korean Intellectual Property Office, which is incorporated herein by reference in its entirety.

BACKGROUND

1. Technical Field

Embodiments of the disclosure may generally relate to an electronic device which corrects an error included in data and checks an error included in data.

2. Related Art

In order to increase the operating speed of a semiconductor device, a scheme of inputting/outputting a plurality of data in each clock cycle is used. In the case where an input/output speed of data is increased, the probability of an error occurring during a data transmission process also increases. Therefore, a separate device and method for ensuring the reliability of data transmission are additionally used.

There is used a method of generating error codes capable of checking the occurrence of an error and transmitting the error codes together with data, at each time of transmitting data, thereby ensuring the reliability of data transmission. The error codes include a cyclic redundancy check (CRC) code and an error detection code (EDC) capable of detecting an error that has occurred and an error correction code (ECC) capable of self-correcting an error when it has occurred.

SUMMARY

Various embodiments are directed to an electronic device which compensates for a difference in delay amounts and a difference in time between error check signals including error information on data inputted and outputted to and from memory regions located at different locations, and sums and outputs the error check signals between which the difference in delay amounts and the difference in time are compensated for.

In an embodiment, an electronic device may include: a replica delay circuit configured to generate a delayed error check signal by delaying a first error check signal including error information of first data stored in a first memory region; and an error sum signal generation circuit configured to generate an error sum signal by summing a second error check signal including error information of second data stored in a second memory region and the delayed error check signal.

In an embodiment, an electronic device may include: a first error correction circuit configured to generate a first error check signal which is enabled in the case where an error occurs in first data stored in a first memory region, correct the error of the first data and store the error-corrected first data in the first memory region; a second error correction circuit configured to generate a second error check signal which is enabled in the case where an error occurs in second data stored in a second memory region, correct the error of the second data and store the error-corrected second data in the second memory region; a replica delay circuit configured to generate a delayed error check signal by delaying the first error check signal; and an error sum signal generation circuit configured to generate an error sum signal by summing the second error check signal and the delayed error check signal.

In an embodiment, an electronic device may include: a controller configured to output a clock and a command address, sequentially output first to fourth data, and receive an error sum signal; and a semiconductor module including first to fourth memory devices, the semiconductor module configured to output the error sum signal by compensating for differences in delay amount among first to fourth error check signals including error information for the first to fourth data in a write operation depending on the clock and the command address.

In an embodiment, an electronic device may include: a controller configured to output a clock and a command address, and receive first to fourth data and an error sum signal; and a semiconductor module including first to fourth memory devices, the semiconductor module configured to output the error sum signal by compensating for differences in delay amount among first to fourth error check signals including error information for the first to fourth data, stored therein, in a read operation depending on the clock and the command address.

According to the embodiments of the disclosure, an electronic device may compensate for a difference in delay amounts and a difference in time between error check signals including error information on data inputted and outputted to and from memory regions located at different locations, and may sum and output the error check signals between which the difference in delay amount and the difference in time are compensated for, thereby securing the reliability of an error check operation.

Also, according to the embodiments of the disclosure, an electronic device may compensate for a difference in delay amounts and a difference in time between error check signals generated in a plurality of memory devices included in a semiconductor module, and may sum and output, to a controller, the error check signals between which the difference in delay amount and the difference in time are compensated for, thereby allowing the controller to detect an error check operation.

DETAILED DESCRIPTION

The term "preset" means that the numerical value of a parameter is predetermined when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the component may be coupled or connected thereto directly or by the medium of a component. On the other hand, the descriptions of "directly coupled" and "directly connected" should be understood to mean that one component is coupled and connected to another component directly without intervention of still another component.

"Logic high level" and "logic low level" are used to describe logic levels of signals. A signal having a "logic high level" is distinguished from a signal having a "logic low level." For example, when a signal having a first voltage corresponds to a "logic high level," a signal having a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various examples of embodiments of the disclosure will be described in detail with reference to the accompanying drawings. These embodiments are only for illustrating the disclosure, and the scope of protection of the disclosure should not be limited by these embodiments.

Figure 1:
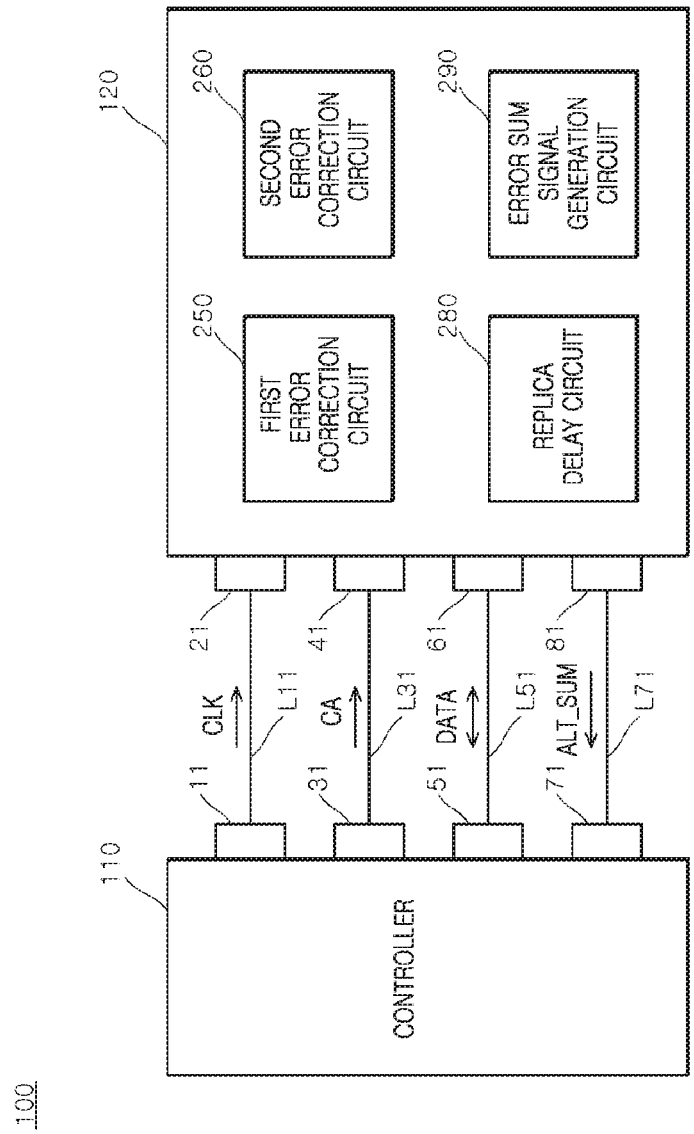
FIG. 1 is a block diagram illustrating a configuration of an electronic device in accordance with an embodiment of the disclosure.

As illustrated in FIG. 1, an electronic device 100 in accordance with an embodiment of the disclosure may include a controller 110 and a semiconductor device 120. The semiconductor device 120 may include a first error correction circuit 250, a second error correction circuit 260, a replica delay circuit 280, and an error sum signal generation circuit 290.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. A first transmission line 11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the semiconductor device 120 through the first transmission line 11 to control the semiconductor device 120. The controller 110 may transmit a command address CA to the semiconductor device 120 through the second transmission line L31 to control the semiconductor device 120. The controller 110 and the semiconductor device 120 may transmit and receive data DATA through the third transmission line L51. The controller 110 may receive an error sum signal ALT_SUM from the semiconductor device 120 through the fourth transmission line L71.

The controller 110 may output, to the semiconductor device 120, the clock CLK, the command address CA, and the data DATA for performing a write operation. The controller 110 may output, to the semiconductor device 120, the clock CLK and the command address CA for performing a read operation. The controller 110 may receive data DATA from the semiconductor device 120 in the read operation. The controller 110 may receive the error sum signal ALT_SUM from the semiconductor device 120 in the write operation and the read operation. The command address CA may be continuously outputted in synchronization with an odd pulse or an even pulse included in the clock CLK.

The semiconductor device 120 may perform an error correction operation and an error check operation during the write operation and the read operation. The semiconductor device 120 may perform the error correction operation of correcting an error included in the data DATA and inputting and outputting the error-corrected data DATA during the write operation and the read operation. The semiconductor device 120 may perform the error check operation of checking an error included in the data DATA and outputting the error sum signal ALT_SUM to the controller 110 during the write operation and the read operation. The error correction operation may be set as an operation of correcting an error, included in the data DATA, by using an error detection code (EDC) and an error correction code (ECC). The error check operation may be set as an operation of detecting whether an error included in the data DATA is correctable, through a cyclic redundancy check. The case where the error sum signal ALT_SUM is disabled during the error check operation means that the number of error occurrence times in the data DATA exceeds a limit and thus an error of the data DATA cannot be corrected. The case where the error sum signal ALT_SUM is disabled during the error check operation means that a repair operation other than the error correction operation is performed through a redundancy region included in the semiconductor device 120.

The first error correction circuit 250 may generate a first error check signal IALT<1> (see FIG. 2) which is enabled in the case where an error occurs in the data DATA during the write operation and the read operation. The first error correction circuit 250 may correct the error of the data DATA and store the error-corrected data DATA in a first memory region 230 (see FIG. 2) during the write operation and the read operation.

The second error correction circuit 260 may generate a second error check signal IALT<2> (see FIG. 2) which is enabled in the case where an error occurs in the data DATA during the write operation and the read operation. The second error correction circuit 260 may correct the error of the data DATA and store the error-corrected data DATA in a second memory region 240 (see FIG. 2) during the write operation and the read operation.

The replica delay circuit 280 may compensate for a difference in delay amount and a difference in time between the first error check signal IALT<1> and the second error check signal IALT<2>.

The error sum signal generation circuit 290 may generate the error sum signal ALT_SUM from the first error check signal IALT<1> and the second error check signal IALT<2> between which the difference in delay amount and the difference in time are compensated for.

Figure 2:
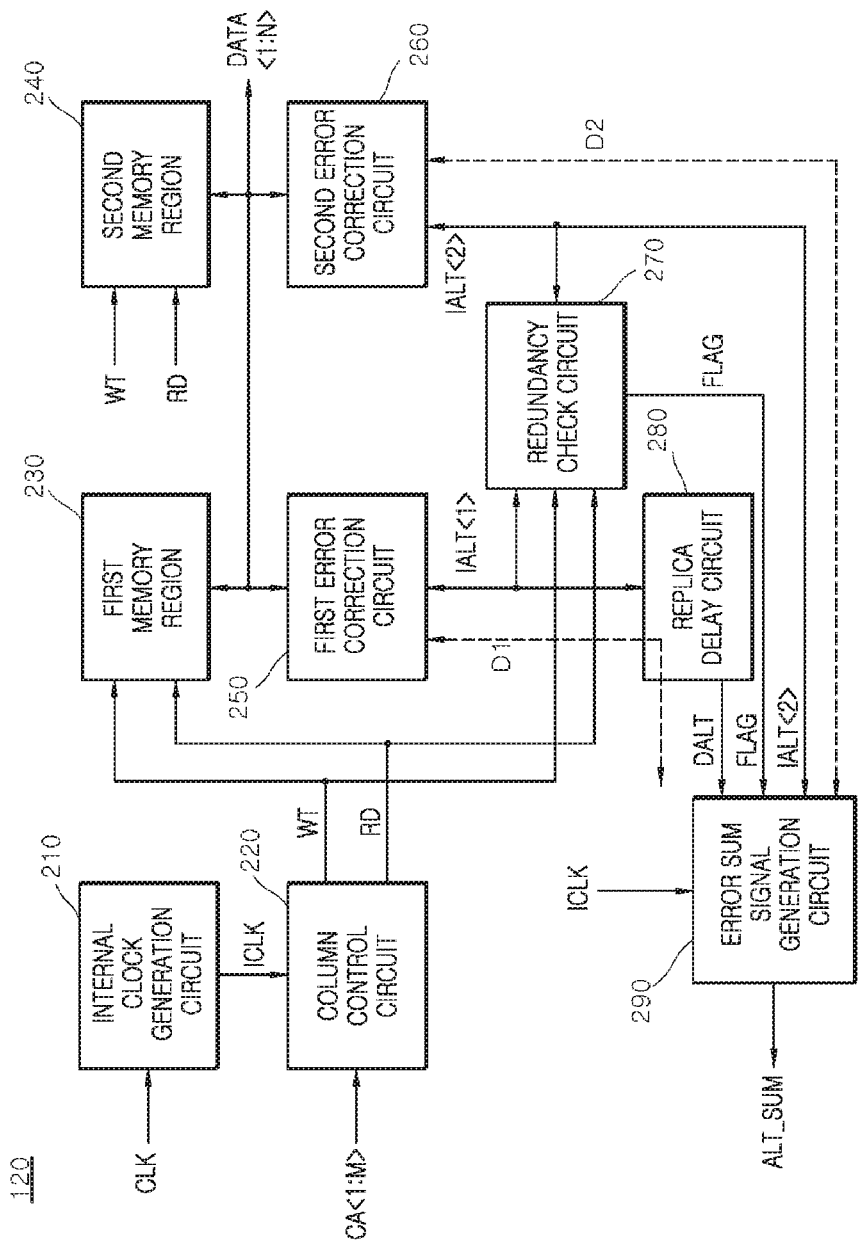
FIG. 2 is a block diagram illustrating a configuration of a semiconductor device included in the electronic device illustrated in FIG. 1.

FIG. 2 is a block diagram illustrating a configuration of the semiconductor device 120 in accordance with the embodiment. As illustrated in FIG. 2, the semiconductor device 120 may include an internal clock generation circuit 210, a column control circuit 220, the first memory region 230, the second memory region 240, the first error correction circuit 250, the second error correction circuit 260, a redundancy check circuit 270, the replica delay circuit 280, and the error sum signal generation circuit 290.

The internal clock generation circuit 210 may receive the clock CLK and generate an internal clock ICLK. The internal clock generation circuit 210 may generate the internal clock ICLK by controlling a phase of the clock CLK. The internal clock generation circuit 210 may generate the internal clock ICLK by dividing a frequency of the clock CLK. The internal clock generation circuit 210 may generate the internal clock ICLK which has a frequency ½ times the frequency of the clock CLK. The clock CLK may be set as a signal which cyclically toggles to control the operation of the electronic device 100 in accordance with the embodiment of the disclosure. The operation in which the internal clock generation circuit 210 generates the internal clock ICLK by dividing the frequency of the clock CLK will be described later in detail with reference to FIG. 3.

The column control circuit 220 may generate a write signal WT and a read signal RD depending on a logic level combination of a command address CA<1:M> in synchronization with the internal clock ICLK. The column control circuit 220 may generate the write signal WT which includes a pulse generated in the case where the command address CA<1:M> has a logic level combination for performing a write operation in synchronization with the internal clock ICLK. The column control circuit 220 may generate the read signal RD which includes a pulse generated in the case where the command address CA<1:M> has a logic level combination for performing a read operation in synchronization with the internal clock ICLK. The number M of bits of the command address CA<1:M> may be set variously depending on an embodiment. Logic level combinations of the command address CA<1:M> for generating the write signal WT and the read signal RD may be set variously depending on an embodiment.

The first memory region 230 may store data DATA<1:N> in the case where the write signal WT is inputted. In the case where the write signal WT is inputted, the first memory region 230 may store the data DATA<1:N> which is error-corrected by the first error correction circuit 250. The first memory region 230 may output data DATA<1:N> stored therein in the case where the read signal RD is inputted.

The second memory region 240 may store data DATA<1:N> in the case where the write signal WT is inputted. In the case where the write signal WT is inputted, the second memory region 240 may store the data DATA<1:N> which is error-corrected by the second error correction circuit 260. The second memory region 240 may output data DATA<1:N> stored therein in the case where the read signal RD is inputted. The write operation and the read operation of the second memory region 240 may be performed after the write operation and the read operation of the first memory region 230 are performed.

The write operations and the read operations of the first memory region 230 and the second memory region 240 may be performed at respective different times depending on an embodiment. An order in which the write operations and the read operations of the first memory region 230 and the second memory region 240 are performed may be set variously depending on an embodiment.

The first error correction circuit 250 may generate the first error check signal IALT<1> which is enabled in the case where an error occurs in the data DATA<1:N> in the write operation. The first error correction circuit 250 may correct the error included in the data DATA<1:N> and store the error-corrected data DATA<1:N> in the first memory region 230 in the write operation. The first error correction circuit 250 may generate the first error check signal IALT<1> which is enabled in the case where an error occurs in the data DATA<1:N> in the read operation. The first error correction circuit 250 may correct the error included in the data DATA<1:N> and output the error-corrected data DATA<1:N> to the controller 110, in the read operation.

The second error correction circuit 260 may generate the second error check signal IALT<2> which is enabled in the case where an error occurs in the data DATA<1:N> in the write operation. The second error correction circuit 260 may correct the error included in the data DATA<1:N> and store the error-corrected data DATA<1:N> in the second memory region 240 in the write operation. The second error correction circuit 260 may generate the second error check signal IALT<2> which is enabled in the case where an error occurs in the data DATA<1:N> in the read operation. The second error correction circuit 260 may correct the error included in the data DATA<1:N> and output the error-corrected data DATA<1:N> to the controller 110, in the read operation.

The redundancy check circuit 270 may generate a flag signal FLAG which is enabled in the case where the write signal WT is inputted and any one of the first error check signal IALT<1> and the second error check signal IALT<2> is generated at least the first predetermined number of times. The redundancy check circuit 270 may generate the flag signal FLAG which is enabled in the case where the write signal WT is inputted and the first error check signal IALT<1> is generated at least the first predetermined number of times. The redundancy check circuit 270 may generate the flag signal FLAG which is enabled in the case where the write signal WT is inputted and the second error check signal IALT<2> is generated at least the first predetermined number of times. The redundancy check circuit 270 may generate the flag signal FLAG which is enabled in the case where the read signal RD is inputted and any one of the first error check signal IALT<1> and the second error check signal IALT<2> is generated at least the first predetermined number of times. The redundancy check circuit 270 may generate the flag signal FLAG which is enabled in the case where the read signal RD is inputted and the first error check signal IALT<1> is generated at least the first predetermined number of times. The redundancy check circuit 270 may generate the flag signal FLAG which is enabled in the case where the read signal RD is inputted and the second error check signal IALT<2> is generated at least the first predetermined number of times. The first predetermined number of times may be set as the number of times any one of the first error check signal IALT<1> and the second error check signal IALT<2> is repeatedly inputted K times. The first predetermined number of times may mean the number of times the number of error occurrence times of the data DATA<1:N> exceeds a limit. The first predetermined number of times K may be set to various natural numbers depending on an embodiment.

The replica delay circuit 280 may delay the first error check signal IALT<1> and thereby generate a delayed error check signal DALT. The replica delay circuit 280 may generate the delayed error check signal DALT by delaying the first error check signal IALT<1> by a delay amount for compensating for a difference in delay amount and a difference in time with which the first error check signal IALT<1> and the second error check signal IALT<2> are generated. The delay amount of the replica delay circuit 280 may be set as a delay amount for compensating for a difference between a delay amount with which the first error check signal IALT<1> is transferred and a delay amount with which the second error check signal IALT<2> is transferred.

The error sum signal generation circuit 290 may generate the error sum signal ALT_SUM by summing the second error check signal IALT<2> and the delayed error check signal DALT. The error sum signal generation circuit 290 may generate the error sum signal ALT_SUM by summing the second error check signal IALT<2> and the delayed error check signal DALT during a period in which the flag signal FLAG is disabled. The error sum signal generation circuit 290 may block the generation of the error sum signal ALT_SUM during a period in which the flag signal FLAG is enabled. The error sum signal ALT_SUM may be disabled in the case where errors occur at least the first predetermined number of times in the data DATA<1:N>.

A distance between the first error correction circuit 250 and the error sum signal generation circuit 290 may be set as a first distance D1. A distance between the second error correction circuit 260 and the error sum signal generation circuit 290 may be set as a second distance D2. The second distance D2 may be physically longer than the first distance D1.

Figure 3:
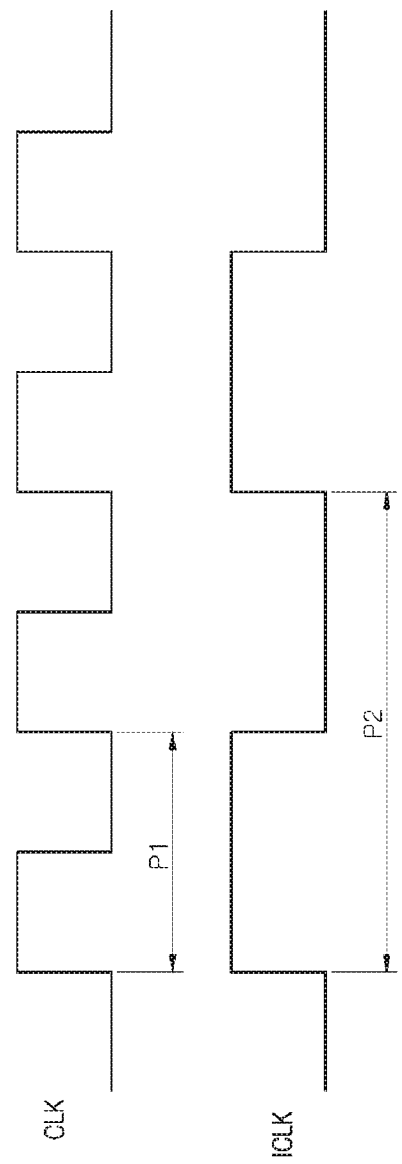
FIG. 3 is a diagram to assist in the explanation of the operation of an internal clock generation circuit included in the semiconductor device illustrated in FIG. 2.

The operation of the internal clock generation circuit 210 will be described below with reference to FIG. 3.

The internal clock generation circuit 210 may generate the internal clock ICLK by dividing a frequency of the clock CLK. One cycle P2 of the internal clock ICLK may be set to twice as long as one cycle P1 of the clock CLK. A frequency of the internal clock ICLK may be set to ½ times a frequency of the clock CLK.

Figure 4:
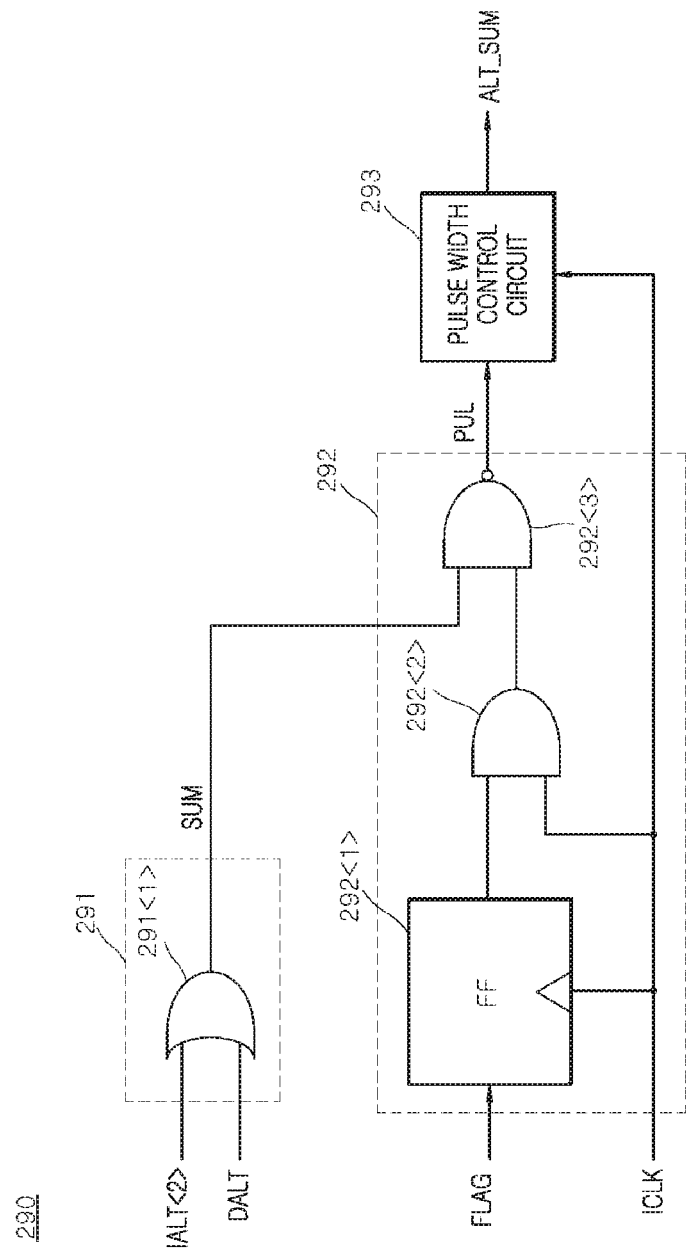
FIG. 4 is a diagram illustrating a configuration of an error sum signal generation circuit included in the semiconductor device illustrated in FIG. 2.

As illustrated in FIG. 4, the error sum signal generation circuit 290 in accordance with the embodiment of the disclosure may include a summing circuit 291, a pulse generation circuit 292, and a pulse width control circuit 293.

The summing circuit 291 may be implemented with an OR gate 291<1>. The summing circuit 291 may generate a sum signal SUM by summing the second error check signal IALT<2> and the delayed error check signal DALT. The summing circuit 291 may generate the sum signal SUM by performing an OR logic operation on the second error check signal IALT<2> and the delayed error check signal DALT. The summing circuit 291 may generate the sum signal SUM of a logic high level in the case where any one of the second error check signal IALT<2> and the delayed error check signal DALT is generated at a logic high level.

The pulse generation circuit 292 may be implemented with a flip-flop 292<1>, an AND gate 292<2>, and a NAND gate 292<3>.

The flip-flop 292<1> may latch the flag signal FLAG in synchronization with the internal clock ICLK and output an output signal. The flip-flop 292<1> may latch the flag signal FLAG and output the output signal during a period in which the internal clock ICLK is inputted at a logic high level. The AND gate 292<2> may buffer the output signal of the flip-flop 292<1> and output an output signal during a period in which the internal clock ICLK is inputted at a logic high level. The NAND gate 292<3> may invert and buffer the sum signal SUM and output a pulse signal PUL during a period in which the output signal of the AND gate 292<2> is inputted at a logic high level.

The pulse generation circuit 292 may generate the pulse signal PUL including a pulse which is generated from the flag signal FLAG and the sum signal SUM in synchronization with the Internal clock ICLK. The pulse generation circuit 292 may generate the pulse signal PUL including a pulse of a logic low level, in the case where the flag signal FLAG is disabled to a logic high level and the sum signal SUM is inputted at a logic high level during a period in which the internal clock ICLK is inputted at a logic high level. The pulse generation circuit 292 may generate the pulse signal PUL of a logic high level in the case where the flag signal FLAG is enabled to a logic low level. The pulse generation circuit 292 may generate the pulse signal PUL of a logic high level in the case where the sum signal SUM is inputted at a logic low level.

The pulse width control circuit 293 may control a pulse width of the pulse signal PUL in synchronization with the internal clock ICLK and thereby generate the error sum signal ALT_SUM. The pulse width control circuit 293 may generate the error sum signal ALT_SUM which has a pulse width during a period in which the internal clock ICLK toggles a second predetermined number of times from a time when a pulse of the pulse signal PUL is inputted at a logic low level. The second predetermined number of times may be set as the number of times the internal clock ICLK is repeatedly inputted L times. The second predetermined number of times L may be set to various natural numbers depending on an embodiment.

Figure 5:
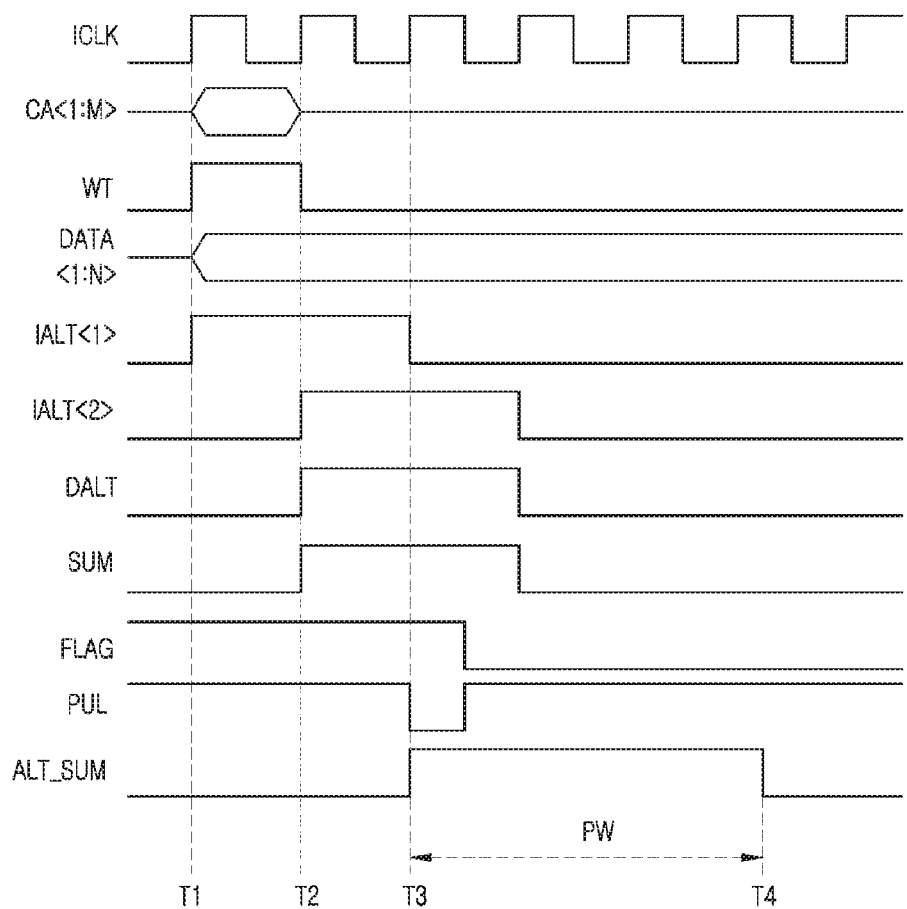
FIG. 5 is a timing diagram to assist in the explanation of the operation of an electronic device in accordance with the embodiment of the disclosure.

Hereinafter, in a write operation of the electronic device 100 in accordance with the embodiment of the disclosure, an error check operation of compensating for a difference in delay amount and a difference in time between the first error check signal IALT<1> and the second error check signal IALT<2> including error information of the data DATA<1:N> stored in the first memory region 230 and the second memory region 240 located at different locations and of generating the error sum signal ALT_SUM by summing the first error check signal IALT<1> and the second error check signal IALT<2> between which the difference in delay amount and the difference in time are compensated for will be described below as an example with reference to FIG. 5.

At a time T1, the controller 110 outputs the clock CLK, the command address CA<1:M>, and the data DATA<1:N> for performing a write operation. The data DATA<1:N> outputted at the time T1 is set as first data to be stored in the first memory region 230.

The internal clock generation circuit 210 generates the internal clock ICLK by dividing a frequency of the clock CLK.

The column control circuit 220 generates the write signal WT which includes a pulse of a logic high level, because the command address CA<1:M> has a logic level combination for performing the write operation in synchronization with the internal clock ICLK.

The first error correction circuit 250 generates the first error check signal IALT<1> which is enabled to a logic high level, in the case where an error occurs in the data DATA<1:N> in the write operation. The first error correction circuit 250 corrects the error included in the data DATA<1:N> and stores the error-corrected data DATA<1:N> in the first memory region 230, in the write operation.

At a time T2, the controller 110 outputs the clock CLK and the data DATA<1:N> for performing a write operation. The data DATA<1:N> outputted at the time T2 is set as second data to be stored in the second memory region 240.

The second error correction circuit 260 generates the second error check signal IALT<2> which is enabled to a logic high level, in the case where an error occurs in the data DATA<1:N> in the write operation. The second error correction circuit 260 corrects the error included in the data DATA<1:N> and stores the error-corrected data DATA<1:N> in the second memory region 240, in the write operation.

The redundancy check circuit 270 generates the flag signal FLAG which is disabled to a logic high level, because the write signal WT is inputted and each of the first error check signal IALT<1> and the second error check signal IALT<2> is inputted less than the first predetermined number of times.

The replica delay circuit 280 generates the delayed error check signal DALT of a logic high level by delaying the first error check signal IALT<1>, generated at the time T1, by a delay amount for compensating for a difference in delay amount and a difference in time with which the first error check signal IALT<1> and the second error check signal IALT<2> are generated.

The summing circuit 291 of the error sum signal generation circuit 290 generates the sum signal SUM of a logic high level by summing the second error check signal IALT<2> and the delayed error check signal DALT.

At a time T3, the pulse generation circuit 292 of the error sum signal generation circuit 290 generates the pulse signal PUL which includes a pulse of a logic low level, because the flag signal FLAG is disabled to a logic high level and the sum signal SUM is inputted at a logic high level during a period in which the internal clock ICLK is inputted at a logic high level.

The pulse width control circuit 293 generates the error sum signal ALT_SUM of a logic high level which has a pulse width PW from the time T3 when a pulse of the pulse signal PUL is inputted at a logic low level to a time T4 when the internal clock ICLK toggles the second predetermined number of times.

The controller 110 receives the error sum signal ALT_SUM of a logic high level and thereby detects the error check operation. Because the error sum signal ALT_SUM is inputted at a logic high level, the controller 110 detects that the write operation has been performed by correcting an error having occurred in the data DATA<1:N>.

The electronic device in accordance with the embodiment of the disclosure configured as indicated above may compensate for a difference in delay amount and a difference in time between error check signals including error information on data inputted and outputted to and from memory regions located at different locations, and may sum and output the error check signals between which the difference in delay amount and the difference in time are compensated for, thereby securing the reliability of an error check operation.

Figure 6:
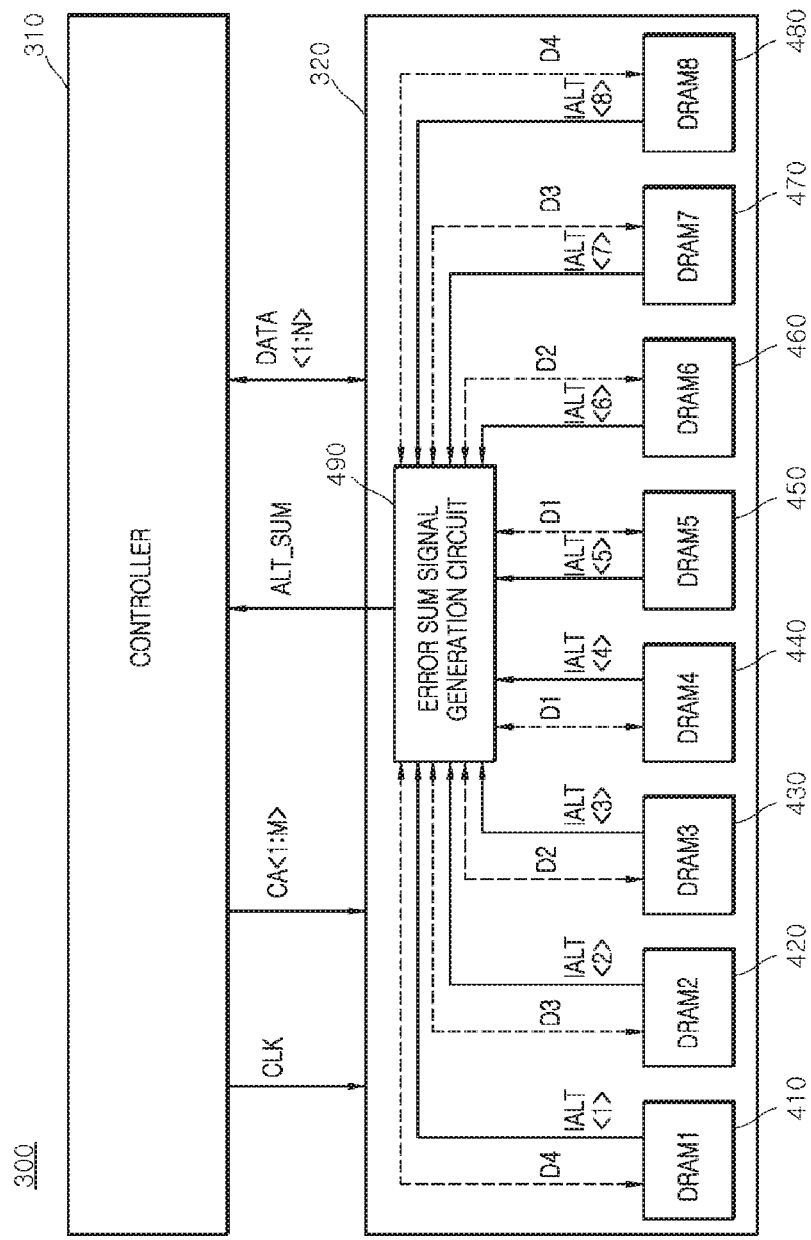
FIG. 6 is a block diagram illustrating a configuration of an electronic device in accordance with another embodiment of the disclosure.

As illustrated in FIG. 6, an electronic device 300 in accordance with another embodiment of the disclosure may include a controller 310, also referred to as a control circuit, and a semiconductor module 320. The semiconductor module 320 may include a first memory device 410, a second memory device 420, a third memory device 430, a fourth memory device 440, a fifth memory device 450, a sixth memory device 460, a seventh memory device 470, an eighth memory device 480, and an error sum signal generation circuit 490.

The controller 310 may output, to the semiconductor module 320, a clock CLK, a command address CA<1:M>, and data DATA<1:N> for performing a write operation. The controller 310 may output, to the semiconductor module 320, the clock CLK and the command address CA<1:M> for performing a read operation. The controller 310 may receive data DATA<1:N> from the semiconductor module 320 in the read operation. The controller 310 may receive an error sum signal ALT_SUM from the semiconductor module 320 in the write operation and the read operation. The command address CA<1:M> may be continuously outputted in synchronization with an odd pulse or an even pulse included in the clock CLK. The controller 310 may be implemented with a configuration which performs the same operation as the controller 110 illustrated in FIG. 1. The controller 310 may be replaced with the controller 110 illustrated in FIG. 1.

The first memory device 410 may correct an error of the data DATA<1:N> and store the error-corrected data DATA<1:N>, in the write operation. The first memory device 410 may generate a first error check signal IALT<1> which is enabled in the case where an error occurs in the data DATA<1:N> in the write operation. The first memory device 410 may correct an error of the data DATA<1:N> and output the error-corrected data DATA<1:N>, in the read operation. The first memory device 410 may generate the first error check signal IALT<1> which is enabled in the case where an error occurs in the data DATA<1:N> in the read operation.

The second memory device 420 may correct an error of the data DATA<1:N> and store the error-corrected data DATA<1:N>, in the write operation. The second memory device 420 may generate a second error check signal IALT<2> which is enabled in the case where an error occurs in the data DATA<1:N> in the write operation. The second memory device 420 may correct an error of the data DATA<1:N> and output the error-corrected data DATA<1:N>, in the read operation. The second memory device 420 may generate the second error check signal IALT<2> which is enabled in the case where an error occurs in the data DATA<1:N> in the read operation.

The third memory device 430 may correct an error of the data DATA<1:N> and store the error-corrected data DATA<1:N>, in the write operation. The third memory device 430 may generate a third error check signal IALT<3> which is enabled in the case where an error occurs in the data DATA<1:N> in the write operation. The third memory device 430 may correct an error of the data DATA<1:N> and output the error-corrected data DATA<1:N>, in the read operation. The third memory device 430 may generate the third error check signal IALT<3> which is enabled in the case where an error occurs in the data DATA<1:N> in the read operation.

The fourth memory device 440 may correct an error of the data DATA<1:N> and store the error-corrected data DATA<1:N>, in the write operation. The fourth memory device 440 may generate a fourth error check signal IALT<4> which is enabled in the case where an error occurs in the data DATA<1:N> in the write operation. The fourth memory device 440 may correct an error of the data DATA<1:N> and output the error-corrected data DATA<1:N>, in the read operation. The fourth memory device 440 may generate the fourth error check signal IALT<4> which is enabled in the case where an error occurs in the data DATA<1:N> in the read operation.

The fifth memory device 450 may correct an error of the data DATA<1:N> and store the error-corrected data DATA<1:N>, in the write operation. The fifth memory device 450 may generate a fifth error check signal IALT<5> which is enabled in the case where an error occurs in the data DATA<1:N> in the write operation. The fifth memory device 450 may correct an error of the data DATA<1:N> and output the error-corrected data DATA<1:N>, in the read operation. The fifth memory device 450 may generate the fifth error check signal IALT<5> which is enabled in the case where an error occurs in the data DATA<1:N> in the read operation.

The sixth memory device 460 may correct an error of the data DATA<1:N> and store the error-corrected data DATA<1:N>, in the write operation. The sixth memory device 460 may generate a sixth error check signal IALT<6> which is enabled in the case where an error occurs in the data DATA<1:N> in the write operation. The sixth memory device 460 may correct an error of the data DATA<1:N> and output the error-corrected data DATA<1:N>, in the read operation. The sixth memory device 460 may generate the sixth error check signal IALT<6> which is enabled in the case where an error occurs in the data DATA<1:N> in the read operation.

The seventh memory device 470 may correct an error of the data DATA<1:N> and store the error-corrected data DATA<1:N>, in the write operation. The seventh memory device 470 may generate a seventh error check signal IALT<7> which is enabled in the case where an error occurs in the data DATA<1:N> in the write operation. The seventh memory device 470 may correct an error of the data DATA<1:N> and output the error-corrected data DATA<1:N>, in the read operation. The seventh memory device 470 may generate the seventh error check signal IALT<7> which is enabled in the case where an error occurs in the data DATA<1:N> in the read operation.

The eighth memory device 480 may correct an error of the data DATA<1:N> and store the error-corrected data DATA<1:N>, in the write operation. The eighth memory device 480 may generate an eighth error check signal IALT<8> which is enabled in the case where an error occurs in the data DATA<1:N> in the write operation. The eighth memory device 480 may correct an error of the data DATA<1:N> and output the error-corrected data DATA<1:N>, in the read operation. The eighth memory device 480 may generate the eighth error check signal IALT<8> which is enabled in the case where an error occurs in the data DATA<1:N> in the read operation.

The error sum signal generation circuit 490 may compensate for differences in delay amount among the first to eighth error check signals IALT<1:8>. The error sum signal generation circuit 490 may generate the error sum signal ALT_SUM by summing the first to eighth error check signals IALT<1:8> among which the differences in delay amount are compensated for.

The fourth memory device 440 and the fifth memory device 450 may each have a first distance D1 from the error sum signal generation circuit 490. The third memory device 430 and the sixth memory device 460 may each have a second distance D2 from the error sum signal generation circuit 490. The second memory device 420 and the seventh memory device 470 may each have a third distance D3 from the error sum signal generation circuit 490. The first memory device 410 and the eighth memory device 480 may each have a fourth distance D4 from the error sum signal generation circuit 490. The fourth distance D4 may be a physically longer distance than the third distance D3. The third distance D3 may be a physically longer distance than the second distance D2. The second distance D2 may be a physically longer distance than the first distance D1.

The semiconductor module 320 may perform an error correction operation and an error check operation during the write operation and the read operation. The semiconductor module 320 may perform the error correction operation of correcting an error included in the data DATA<1:N> and inputting and outputting the error-corrected data DATA<1:N> during the write operation and the read operation. The semiconductor module 320 may compensate for differences in delay amount among the first to eighth error check signals IALT<1:8> including error information on the data DATA<1:N> in the write operation and the read operation depending on the clock CLK and the command address CA<1:M>, and may output the error sum signal ALT_SUM by summing the first to eighth error check signals IALT<1:8> among which the differences in delay amount are compensated for. The error correction operation may be set as an operation of correcting an error, included in the data DATA<1:N>, by using an error detection code (EDC) and an error correction code (ECC). The error check operation may be set as an operation of detecting whether an error included in the data DATA<1:N> is correctable, through a cyclic redundancy check. The case where the error sum signal ALT_SUM is disabled during the error check operation means that the number of error occurrence times in the data DATA<1:N> exceeds a limit and thus an error of the data DATA<1:N> cannot be corrected. The case where the error sum signal ALT_SUM is disabled during the error check operation means that a repair operation other than the error correction operation is performed through a redundancy region included in the semiconductor module 320.

Figure 7:
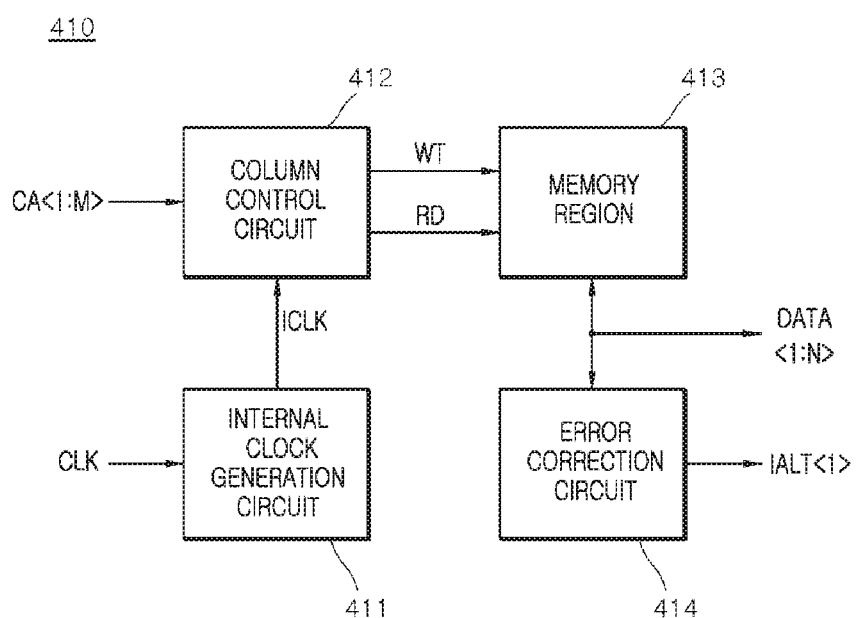
FIG. 7 is a block diagram illustrating a configuration of a first memory device included in a semiconductor module illustrated in FIG. 6.

As illustrated in FIG. 7, the first memory device 410 in accordance with the embodiment of the disclosure may include an internal clock generation circuit 411, a column control circuit 412, a memory region 413, and an error correction circuit 414.

The internal clock generation circuit 411 may receive the clock CLK and generate an internal clock ICLK. The internal clock generation circuit 411 may generate the internal clock ICLK by controlling a phase of the clock CLK. The internal clock generation circuit 411 may generate the internal clock ICLK by dividing a frequency of the clock CLK. The internal clock generation circuit 411 may generate the internal clock ICLK which has a frequency ½ times the frequency of the clock CLK. The clock CLK may be set as a signal which cyclically toggles to control the operation of the electronic device 300 in accordance with the embodiment of the disclosure. The internal clock generation circuit 411 may be implemented with the same circuit and perform the same operation as the internal clock generation circuit 210 illustrated in FIG. 2. The internal clock generation circuit 411 may be replaced with the internal clock generation circuit 210 illustrated in FIG. 2.

The column control circuit 412 may generate a write signal WT and a read signal RD depending on a logic level combination of the command address CA<1:M> in synchronization with the internal clock ICLK. The column control circuit 412 may generate the write signal WT which includes a pulse generated in the case where the command address CA<1:M> has a logic level combination for performing a write operation in synchronization with the internal clock ICLK. The column control circuit 412 may generate the read signal RD which includes a pulse generated in the case where the command address CA<1:M> has a logic level combination for performing a read operation in synchronization with the internal clock ICLK. The column control circuit 412 may be implemented with the same circuit and perform the same operation as the column control circuit 220 illustrated in FIG. 2. The column control circuit 412 may be replaced with the column control circuit 220 illustrated in FIG. 2.

The memory region 413 may store the data DATA<1:N> in the case where the write signal WT is inputted. In the case where the write signal WT is inputted, the memory region 413 may store the data DATA<1:N> which is error-corrected by the error correction circuit 414. The memory region 413 may output the data DATA<1:N> stored therein in the case where the read signal RD is inputted. The memory region 413 may be implemented with the same circuit and perform the same operation as the first memory region 230 and the second memory region 240 illustrated in FIG. 2. The memory region 413 may be replaced with the first memory region 230 and the second memory region 240 illustrated in FIG. 2.

The error correction circuit 414 may generate the first error check signal IALT<1> which is enabled in the case where an error occurs in the data DATA<1:N> in the write operation. The error correction circuit 414 may correct the error included in the data DATA<1:N> and store the error-corrected data DATA<1:N> in the memory region 413, in the write operation. The error correction circuit 414 may generate the first error check signal IALT<1> which is enabled in the case where an error occurs in the data DATA<1:N> in the read operation. The error correction circuit 414 may correct the error included in the data DATA<1:N> and output the error-corrected data DATA<1:N> to the controller 310, in the read operation. The error correction circuit 414 may be implemented with the same circuit and perform the same operation as the first error correction circuit 250 and the second error correction circuit 260 illustrated in FIG. 2. The error correction circuit 414 may be replaced with the first error correction circuit 250 and the second error correction circuit 260 illustrated in FIG. 2.

Meanwhile, because the second memory device 420, the third memory device 430, the fourth memory device 440, the fifth memory device 450, the sixth memory device 460, the seventh memory device 470, and the eighth memory device 480 illustrated in FIG. 6 are implemented with the same circuit and perform the same operation as the first memory device 410 illustrated in FIG. 7 with the exception that only input/output signals are different, detailed descriptions thereof will be omitted herein.

Figure 8:
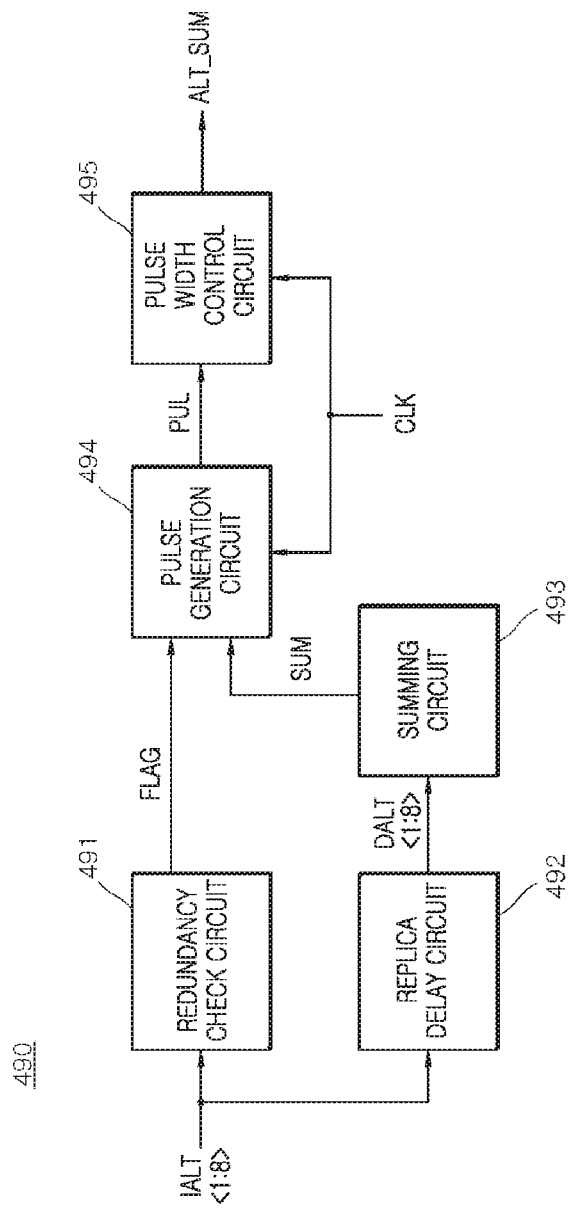
FIG. 8 is a block diagram illustrating a configuration of an error sum signal generation circuit included in the semiconductor module illustrated in FIG. 6.

As illustrated in FIG. 8, the error sum signal generation circuit 490 in accordance with the embodiment of the disclosure may include a redundancy check circuit 491, a replica delay circuit 492, a summing circuit 493, a pulse generation circuit 494, and a pulse width control circuit 495.

The redundancy check circuit 491 may generate a flag signal FLAG which is enabled in the case where any one of the first to eighth error check signals IALT<1:8> is generated at least a first predetermined number of times. The first predetermined number of times may be set as the number of times any one of the first to eighth error check signals IALT<1:8> is repeatedly inputted K times. The first predetermined number of times K may be set to various natural numbers depending on an embodiment. The redundancy check circuit 491 may be implemented with the same circuit and perform the same operation as the redundancy check circuit 270 illustrated in FIG. 2 with the exception that only input/output signals are different. The redundancy check circuit 491 may be replaced with the redundancy check circuit 270 illustrated in FIG. 2.

The replica delay circuit 492 may generate first to eighth delayed error check signals DALT<1:8> by delaying the first to eighth error check signals IALT<1:8> by delay amounts for compensating for differences in delay amount and differences in time with which the first to eighth error check signals IALT<1:8> are generated. The delay amounts of the replica delay circuit 492 may be set such that the first to eighth delayed error check signals DALT<1:8> are generated at the same time.

The summing circuit 493 may generate a sum signal SUM by summing the first to eighth delayed error check signals DALT<1:8>. The summing circuit 493 may generate the sum signal SUM by performing an OR logic operation on the first to eighth delayed error check signals DALT<1:8>.

The pulse generation circuit 494 may generate a pulse signal PUL including a pulse which is generated from the flag signal FLAG and the sum signal SUM in synchronization with the clock CLK. The pulse generation circuit 494 may generate the pulse signal PUL including a pulse of a logic low level, in the case where the flag signal FLAG is disabled to a logic high level and the sum signal SUM is inputted at a logic high level during a period in which the clock CLK is inputted at a logic high level. The pulse generation circuit 494 may generate the pulse signal PUL of a logic high level in the case where the flag signal FLAG is enabled to a logic low level. The pulse generation circuit 494 may generate the pulse signal PUL of a logic high level in the case where the sum signal SUM is inputted at a logic low level.

The pulse width control circuit 495 may control a pulse width of the pulse signal PUL in synchronization with the clock CLK and thereby generate the error sum signal ALT_SUM. The pulse width control circuit 495 may generate the error sum signal ALT_SUM which has a pulse width during a period in which the clock CLK toggles a second predetermined number of times from a time when a pulse of the pulse signal PUL is inputted at a logic low level. The second predetermined number of times may be set as the number of times the clock CLK is repeatedly inputted L times. The second predetermined number of times L may be set to various natural numbers depending on an embodiment.

Figure 9:
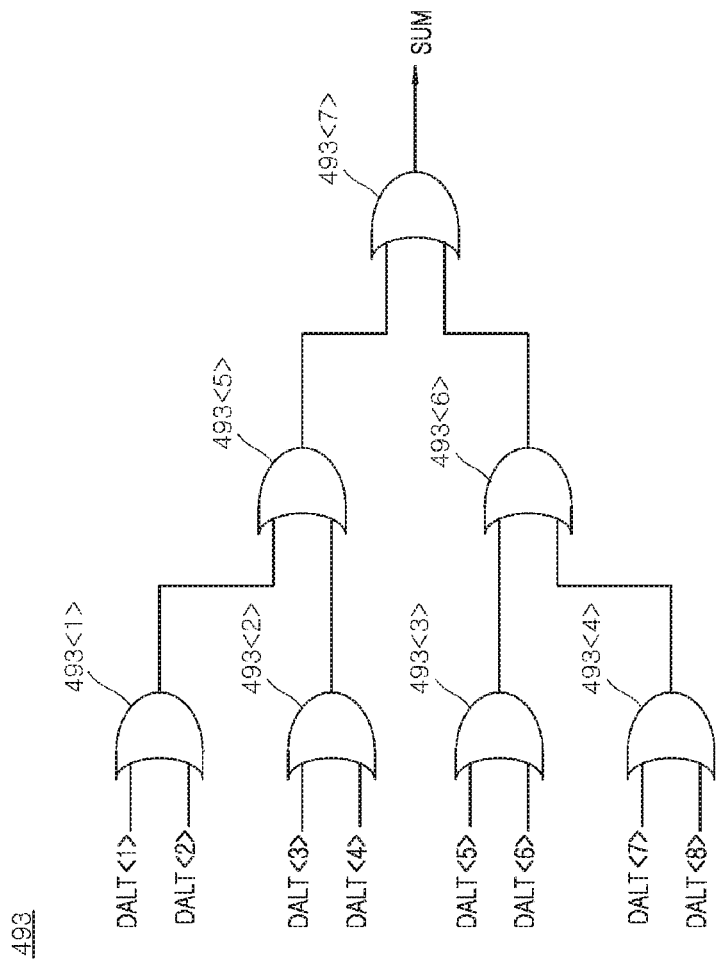
FIG. 9 is a circuit diagram illustrating a configuration of a summing circuit included in the error sum signal generation circuit illustrated in FIG. 8.

As illustrated in FIG. 9, the summing circuit 493 in accordance with the embodiment of the disclosure may be implemented with OR gates 493<1:7>.

The OR gates 493<1:7> may generate the sum signal SUM by summing the first to eighth delayed error check signals DALT<1:8>. The OR gates 493<1:7> may generate the sum signal SUM by performing OR logic operations on the first to eighth delayed error check signals DALT<1:8>. The OR gates 493<1:7> may generate the sum signal SUM of a logic high level in the case where at least any one of the first to eighth delayed error check signals DALT<1:8> is generated at a logic high level.

Figure 10:
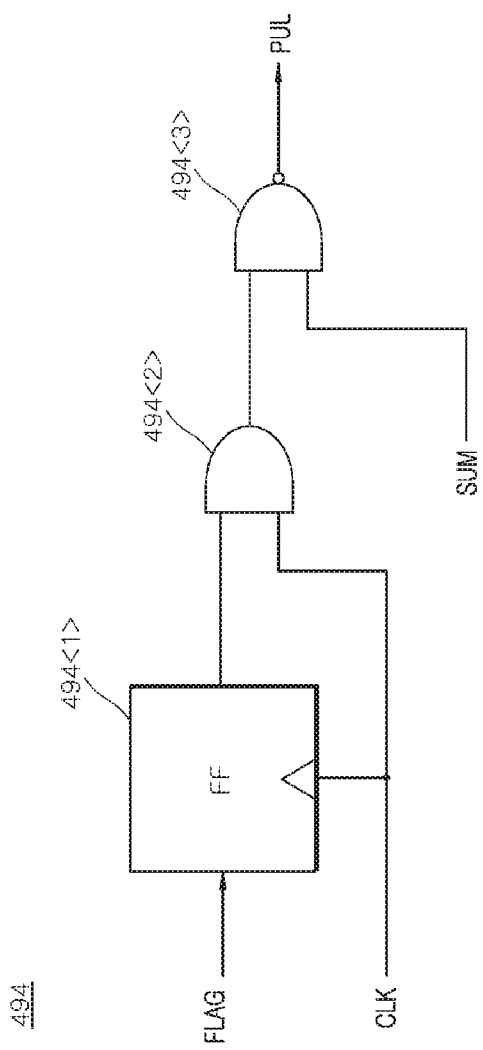
FIG. 10 is a diagram illustrating a configuration of a pulse generation circuit included in the error sum signal generation circuit illustrated in FIG. 8.

As illustrated in FIG. 10, the pulse generation circuit 494 in accordance with the embodiment of the disclosure may be implemented with a flip-flop 494<1>, an AND gate 494<2>, and a NAND gate 494<3>.

The flip-flop 494<1> may latch the flag signal FLAG in synchronization with the clock CLK and output an output signal. The flip-flop 494<1> may latch the flag signal FLAG and output the output signal during a period in which the clock CLK is inputted at a logic high level. The AND gate 494<2> may buffer the output signal of the flip-flop 494<1> and output an output signal during a period in which the clock CLK is inputted at a logic high level. The NAND gate 494<3> may invert and buffer the sum signal SUM and output the pulse signal PUL during a period in which the output signal of the AND gate 494<2> is inputted at a logic high level.

The pulse generation circuit 494 may generate the pulse signal PUL including a pulse which is generated from the flag signal FLAG and the sum signal SUM in synchronization with the clock CLK. The pulse generation circuit 494 may generate the pulse signal PUL including a pulse of a logic low level, in the case where the flag signal FLAG is disabled to a logic high level and the sum signal SUM is inputted at a logic high level during a period in which the clock CLK is inputted at a logic high level. The pulse generation circuit 494 may generate the pulse signal PUL of a logic high level in the case where the flag signal FLAG is enabled to a logic low level. The pulse generation circuit 494 may generate the pulse signal PUL of a logic high level in the case where the sum signal SUM is inputted at a logic low level.

Figure 11:
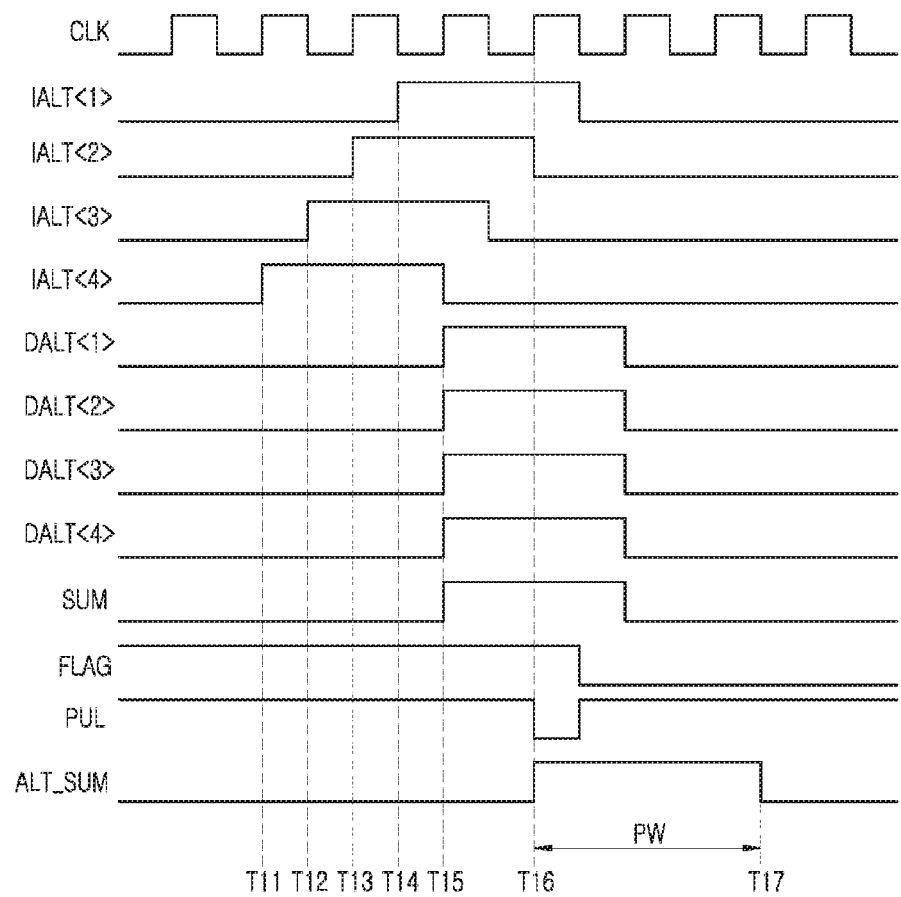
FIG. 11 is a timing diagram to assist in the explanation of the operation of an electronic device in accordance with the embodiment of the disclosure.

Hereinafter, in a write operation of the electronic device 300 in accordance with the embodiment of the disclosure, an error check operation of compensating for differences in delay amount and differences in time among the first to fourth error check signals IALT<1:4> generated in the first to fourth memory devices 410, 420, 430, and 440 located at different locations and of generating the error sum signal ALT_SUM by summing the first to fourth error check signals IALT<1:4> among which the differences in delay amount and the differences in time are compensated for will be described below as an example with reference to FIG. 11.

At a time T11, the fourth memory device 440 which has the first distance D1 from the error sum signal generation circuit 490 generates the fourth error check signal IALT<4> which is enabled to a logic high level in the case where an error occurs in the data DATA<1:N>.

At a time T12, the third memory device 430 which has the second distance D2 from the error sum signal generation circuit 490 generates the third error check signal IALT<3> which is enabled to a logic high level in the case where an error occurs in the data DATA<1:N>.

At a time T13, the second memory device 420 which has the third distance D3 from the error sum signal generation circuit 490 generates the second error check signal IALT<2> which is enabled to a logic high level in the case where an error occurs in the data DATA<1:N>.

At a time T14, the first memory device 410 which has the fourth distance D4 from the error sum signal generation circuit 490 generates the first error check signal IALT<1> which is enabled to a logic high level in the case where an error occurs in the data DATA<1:N>.

At a time T15, the redundancy check circuit 491 generates the flag signal FLAG which is disabled to a logic high level, because each of the first to fourth error check signals IALT<1:4> is inputted less than the first predetermined number of times.

The replica delay circuit 492 generates the first to fourth delayed error check signals DALT<1:4> which are generated at logic high levels, by delaying the first to fourth error check signals IALT<1:4> by delay amounts for compensating for differences in delay amount and differences in time among the first to fourth error check signals IALT<1:4> generated from the time T11 to the time T14.

The summing circuit 493 generates the sum signal SUM of a logic high level by summing the first to fourth delayed error check signals DALT<1:4>.

At a time T16, the pulse generation circuit 494 generates the pulse signal PUL including a pulse of a logic low level, because the flag signal FLAG is disabled to a logic high level and the sum signal SUM is inputted at a logic high level during a period in which the clock CLK is inputted at a logic high level.

The pulse width control circuit 495 generates the error sum signal ALT_SUM of a logic high level which has a pulse width PW from the time T16 when a pulse of the pulse signal PUL is inputted at a logic low level to a time T17 when the clock CLK toggles the second predetermined number of times.

The controller 310 receives the error sum signal ALT_SUM of a logic high level and thereby detects the error check operation. Because the error sum signal ALT_SUM is inputted at a logic high level, the controller 310 detects that the write operation has been performed by correcting errors having occurred in the data DATA<1:N> stored in the first to fourth memory devices 410, 420, 430, and 440.

Figure 12:
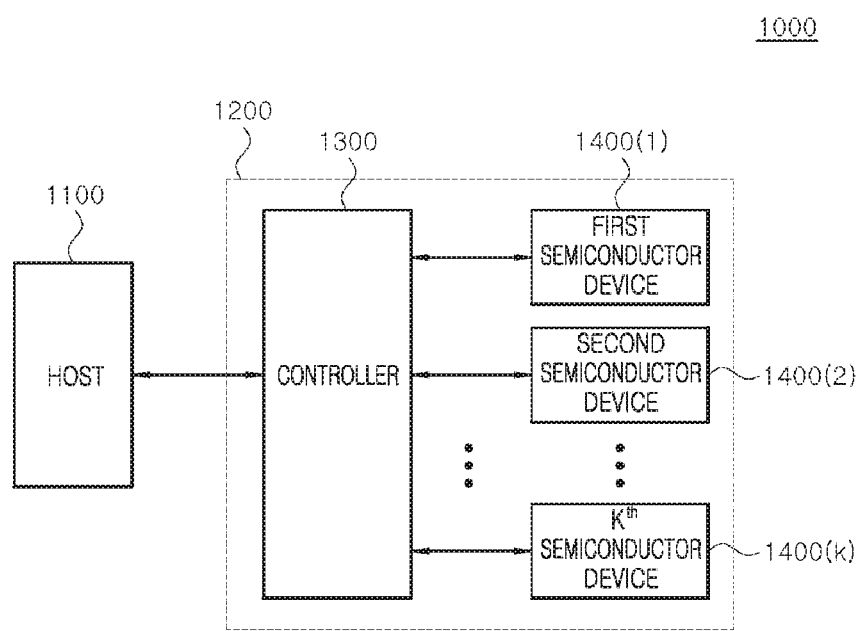
FIG. 12 is a block diagram illustrating a configuration of an electronic system to which the electronic device illustrated in FIGS. 1 to 11 is applied.

FIG. 12 is a block diagram illustrating a configuration of an electronic system 1000 in accordance with an embodiment of the disclosure. As illustrated in FIG. 12, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include, but is not limited to, MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and semiconductor devices 1400(k:1). The controller 1300 may control the semiconductor devices 1400(k:1) such that each of the semiconductor devices 1400(k:1) performs a write operation and a read operation. Each of the semiconductor devices 1400(k:1) may compensate for a difference in delay amount and a difference in time between error check signals including error information on data inputted and outputted to and from memory regions located at different locations, and may sum and output the error check signals between which the difference in delay amount and the difference in time are compensated for, thereby securing the reliability of an error check operation.

The controller 1300 may be implemented with the controller 110 illustrated in FIG. 1 or the controller 310 illustrated in FIG. 6. Each of the semiconductor devices 1400(k:1) may be implemented with the semiconductor device 120 illustrated in FIG. 1 and the semiconductor module 320 illustrated in FIG. 6. According to an embodiment, each of the semiconductor devices 1400(k:1) may be implemented with one among a DRAM (dynamic random access memory), a PRAM (phase change random access memory), an RRAM (resistive random access memory), an MRAM (magnetic random access memory) and an FRAM (ferroelectric random access memory).

While various embodiments have been described above, it will be understood to those skilled in the art that the embodiments described are by way of example only. Accordingly, the electronic device for executing an error correction operation and an error check operation described herein should not be limited based on the described embodiments.

What is claimed is:

1. An electronic device comprising:
a replica delay circuit configured to generate a delayed error check signal by delaying a first error check signal including error information of first data stored in a first memory region; and
an error sum signal generation circuit configured to generate an error sum signal by summing a second error check signal including error information of second data stored in a second memory region and the delayed error check signal.

2. The electronic device according to claim 1, wherein a delay amount of the replica delay circuit is set to compensate for a difference between a delay amount with which the first error check signal is transferred and a delay amount with which the second error check signal is transferred.

3. The electronic device according to claim 1, wherein:
the first error check signal is generated by a first error correction circuit which is disposed adjacent to the first memory region; and
the second error check signal is generated by a second error correction circuit which is disposed adjacent to the second memory region.

4. The electronic device according to claim 3, wherein a first distance between the first error correction circuit and the error sum signal generation circuit is physically shorter than a second distance between the second error correction circuit and the error sum signal generation circuit.

5. The electronic device according to claim 1, wherein the error sum signal is disabled when a number of error occurrences in each of the first and second data is equal to or greater than a predetermined number.

6. The electronic device according to claim 1, further comprising:
a first error correction circuit configured to generate the first error check signal which is enabled when an error occurs in the first data, correct the error in the first data, and store the error-corrected first data in the first memory region;
a second error correction circuit configured to generate the second error check signal which is enabled when an error occurs in the second data, correct the error in the second data, and store the error-corrected second data in the second memory region; and
a redundancy check circuit configured to generate a flag signal which is enabled when any one of the first error check signal and the second error check signal is generated at least a predetermined number of times.

7. The electronic device according to claim 1, wherein the error sum signal generation circuit comprises:
a summing circuit configured to generate a sum signal by summing the second error check signal and the delayed error check signal;
a pulse signal generation circuit configured to generate a pulse signal which includes a pulse generated from a flag signal and the sum signal in synchronization with an internal clock; and
a pulse width control circuit configured to generate the error sum signal by controlling a pulse width of the pulse signal in synchronization with the internal clock.

8. The electronic device according to claim 1, wherein the error sum signal generation circuit is configured to disable the error sum signal when a repair operation is performed instead of an error correction operation for correcting errors included in the first data and the second data.

9. An electronic device comprising:
a first error correction circuit configured to generate a first error check signal which is enabled when an error occurs in first data stored in a first memory region, correct the error in the first data, and store the error-corrected first data in the first memory region;
a second error correction circuit configured to generate a second error check signal which is enabled when an error occurs in second data stored in a second memory region, correct the error in the second data, and store the error-corrected second data in the second memory region;
a replica delay circuit configured to generate a delayed error check signal by delaying the first error check signal; and
an error sum signal generation circuit configured to generate an error sum signal by summing the second error check signal and the delayed error check signal.

10. The electronic device according to claim 9,
wherein the first data and the second data are sequentially inputted from outside the electronic device in a write operation, and
wherein the second error correction circuit generates the second error check signal for the second data after the first error check signal for the first data is generated.

11. The electronic device according to claim 9, wherein the replica delay circuit is set to a delay amount to compensate for a timing difference between when the first error check signal is generated and when the second error check signal is generated.

12. The electronic device according to claim 9, wherein the error sum signal is disabled when a number of error occurrences in each of the first and second data is equal to or greater than a predetermined number.

13. The electronic device according to claim 9, wherein the error sum signal generation circuit comprises:
a summing circuit configured to generate a sum signal by summing the second error check signal and the delayed error check signal;
a pulse signal generation circuit configured to generate a pulse signal which includes a pulse generated by latching a flag signal in synchronization with an internal clock; and
a pulse width control circuit configured to generate the error sum signal by controlling a pulse width of the pulse signal in synchronization with the internal clock.

14. An electronic device comprising:
a controller configured to output a clock and a command address, sequentially output first to fourth data, and receive an error sum signal; and
a semiconductor module including first to fourth memory devices,
wherein the semiconductor module is configured to generate the error sum signal by summing first to fourth error check signals, and
wherein the semiconductor module is configured to output the error sum signal by compensating for differences in delay amounts among the first to fourth error check signals including error information for the first to fourth data in a write operation depending on the clock and the command address.

15. The electronic device according to claim 14, wherein the error sum signal is disabled when the number of error occurrences in each of the first to fourth data is equal to or greater than a predetermined number.

16. The electronic device according to claim 14, wherein the semiconductor module further includes an error sum signal generation circuit configured to compensate for the differences in delay amounts among the first to fourth error check signals and generate the error sum signal by summing the first to fourth error check signals among which the differences in delay amounts are compensated for.

17. The electronic device according to claim 16, wherein:
the first memory device has a first distance from the error sum signal generation circuit;
the second memory device has a second distance from the error sum signal generation circuit;
the third memory device has a third distance from the error sum signal generation circuit; and
the fourth memory device has a fourth distance from the error sum signal generation circuit.

18. The electronic device according to claim 17, wherein:
the fourth distance is physically longer than the third distance difference;
the third distance is physically longer than the second distance difference; and
the second distance is physically longer than the first distance difference.

19. The electronic device according to claim 16, wherein the error sum signal generation circuit comprises:
a redundancy check circuit configured to generate a flag signal which is enabled when any of the first to fourth error check signals is generated at least a predetermined number of times;
a replica delay circuit configured to generate first to fourth delayed error check signals by compensating for differences in delay amounts among the first to fourth error check signals;
a summing circuit configured to generate a sum signal by summing the first to fourth delayed error check signals;
a pulse generation circuit configured to generate a pulse signal which includes a pulse generated from the flag signal and the sum signal in synchronization with the clock; and
a pulse width control circuit configured to output the error sum signal by controlling a pulse width of the pulse signal in synchronization with the clock.

20. The electronic device according to claim 14,
wherein the first memory device is configured to: correct an error in the first data and store the error-corrected first data, and generate the first error check signal which is enabled when an error occurs in the first data,
wherein the second memory device is configured to: correct an error of the second data and store the error-corrected second data, and generate the second error check signal which is enabled when an error occurs in the second data,
wherein the third memory device is configured to: correct an error in the third data and store the error-corrected third data, and generate the third error check signal which is enabled when an error occurs in the third data, and
wherein the fourth memory device is configured to: correct an error in the fourth data and store the error-corrected fourth data, and generate the fourth error check signal which is enabled when an error occurs in the fourth data.

21. An electronic device comprising:
a controller configured to output a clock and a command address, and receive first to fourth data and an error sum signal; and
a semiconductor module including first to fourth memory devices,
wherein the semiconductor module is configured to generate the error sum signal by summing first to fourth error check signals, and
wherein the semiconductor module is configured to output the error sum signal by compensating for differences in delay amounts among the first to fourth error check signals including error information for the first to fourth data, stored therein, in a read operation depending on the clock and the command address.

* * * * *